US007931114B2

(12) United States Patent
LeClear et al.

(10) Patent No.: US 7,931,114 B2
(45) Date of Patent: Apr. 26, 2011

(54) ADAPTER OR APPLIANCE WITH A USER INTERFACE WINDOW

(75) Inventors: Douglas D. LeClear, Coloma, MI (US); Ruben E. Rothermel, Berrien Springs, MI (US); Andrew M. Tenbarge, Saint Joseph, MI (US); James W. Kendall, Stevensville, MI (US); Richard A. McCoy, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 436 days.

(21) Appl. No.: 12/116,425

(22) Filed: May 7, 2008

(65) Prior Publication Data

US 2008/0203868 A1 Aug. 28, 2008

Related U.S. Application Data

(63) Continuation of application No. 11/650,222, filed on Jan. 4, 2007, now Pat. No. 7,686,127.

(51) Int. Cl.
*H05K 5/02* (2006.01)
*H05K 5/00* (2006.01)

(52) U.S. Cl. ......... 181/150; 361/730; 381/301; 381/333

(58) Field of Classification Search .................. 181/150; 361/729, 728, 730; 709/203; 62/531; 381/77, 381/333, 334, 301, 306

See application file for complete search history.

(56) References Cited

U.S. PATENT DOCUMENTS 2,795,639 A 6/1957 Rawson
3,054,024 A 9/1962 Van Dillen, et al.
3,836,221 A 9/1974 Whistler, Jr.
3,858,091 A 12/1974 Wilkinson
D273,836 S 5/1984 Ohyama et al.
4,479,263 A * 10/1984 Rosenfeldt et al. ........... 398/140
4,546,267 A 10/1985 Urfiner
4,628,351 A 12/1986 Heo
4,691,195 A 9/1987 Sigelman et al.
4,718,740 A 1/1988 Cox
4,773,032 A 9/1988 Uehara et al.
4,814,759 A 3/1989 Gombrich et al.
4,884,626 A 12/1989 Filipowski (Continued)

FOREIGN PATENT DOCUMENTS

CN 2583586 10/2003

(Continued)

OTHER PUBLICATIONS

Article Entitled "Johnson Controls all-new Overhead Rail System Debuts in Ford F-150 Pickup Truck at North American International Auto Show"—WWW.PRNEWSWIRE.COM (2 Pages).

(Continued)

*Primary Examiner* — Edgardo San Martin

(74) *Attorney, Agent, or Firm* — Robert A. Bacon; McGarry Bair PC

(57) ABSTRACT

An adapter or an appliance for use with an independently operable consumer electronic device having a user interface. The adapter comprises a holding device forming a device cavity capable of admitting the consumer electronic device in a predetermined orientation. An access opening into the device cavity exposes a portion of the consumer electronic device when the consumer electronic device is in the predetermined orientation. The portion of the consumer electronic device exposed includes at least a portion of the user interface.

10 Claims, 10 Drawing Sheets

U.S. PATENT DOCUMENTS

| | | | | |
|---|---|---|---|---|
| 4,969,830 | A | 11/1990 | Daly et al. | |
| 5,173,686 | A | 12/1992 | Fujihara | |
| 5,187,744 | A | 2/1993 | Richter | |
| 5,235,822 | A | 8/1993 | Leonovich, Jr. | |
| 5,281,018 | A | 1/1994 | Cullinan | |
| 5,305,381 | A | 4/1994 | Wang et al. | |
| 5,351,417 | A | 10/1994 | Rubin | |
| 5,382,939 | A | 1/1995 | Hong | |
| 5,408,382 | A | 4/1995 | Schultz et al. | |
| 5,457,745 | A | 10/1995 | Wang et al. | |
| 5,544,010 | A | 8/1996 | Schultz et al. | |
| 5,568,691 | A | 10/1996 | Rubin | |
| 5,644,471 | A | 7/1997 | Schultz et al. | |
| 5,699,226 | A | 12/1997 | Cavello | |
| 5,710,821 | A | 1/1998 | Cheah | |
| 5,739,665 | A | 4/1998 | Bares | |
| 5,797,088 | A * | 8/1998 | Stamegna | 455/345 |
| 5,810,168 | A | 9/1998 | Eggering | |
| 5,815,468 | A * | 9/1998 | Muramatsu et al. | 369/2 |
| 5,836,563 | A | 11/1998 | Hsin-Yung et al. | |
| 5,839,097 | A | 11/1998 | Klausner | |
| 5,864,120 | A | 1/1999 | Vroom et al. | |
| 5,996,956 | A | 12/1999 | Shawver | |
| 5,999,226 | A | 12/1999 | Choi | |
| 6,011,852 | A | 1/2000 | Howard | |
| 6,023,147 | A | 2/2000 | Cargin, Jr. et al. | |
| 6,130,727 | A | 10/2000 | Toyozumi | |
| 6,131,812 | A | 10/2000 | Schneider | |
| 6,191,942 | B1 | 2/2001 | Lee et al. | |
| 6,208,117 | B1 | 3/2001 | Hibi | |
| 6,231,371 | B1 | 5/2001 | Helot | |
| 6,246,575 | B1 | 6/2001 | Barrus et al. | |
| 6,309,230 | B2 | 10/2001 | Helot | |
| 6,359,270 | B1 | 3/2002 | Bridson | |
| 6,375,344 | B1 | 4/2002 | Hanson et al. | |
| 6,378,537 | B1 | 4/2002 | DeHart | |
| 6,385,042 | B1 | 5/2002 | Chen | |
| 6,393,848 | B2 | 5/2002 | Roh et al. | |
| 6,405,049 | B2 | 6/2002 | Herrod et al. | |
| 6,415,036 | B1 | 7/2002 | Ritter et al. | |
| 6,430,946 | B2 | 8/2002 | Roh et al. | |
| 6,453,687 | B2 | 9/2002 | Sharood et al. | |
| 6,480,753 | B1 | 11/2002 | Calder et al. | |
| 6,483,695 | B1 | 11/2002 | Hartstein | |
| 6,490,154 | B2 | 12/2002 | Thompson | |
| 6,519,144 | B1 | 2/2003 | Henrie et al. | |
| 6,557,756 | B1 | 5/2003 | Smith | |
| 6,559,882 | B1 | 5/2003 | Kerchner | |
| 6,608,399 | B2 | 8/2003 | McConnell et al. | |
| 6,634,910 | B2 | 10/2003 | Lieb et al. | |
| 6,646,866 | B2 | 11/2003 | Kao | |
| 6,682,161 | B2 | 1/2004 | Yun | |
| D486,467 | S | 2/2004 | Yuen | |
| 6,761,578 | B1 | 7/2004 | Stavely et al. | |
| 6,765,789 | B2 | 7/2004 | Yang | |
| 6,785,567 | B2 | 8/2004 | Kato | |
| 6,788,529 | B2 | 9/2004 | Homer et al. | |
| 6,792,263 | B1 | 9/2004 | Kite | |
| 6,798,654 | B2 | 9/2004 | Chang et al. | |
| 6,809,295 | B1 | 10/2004 | Vargas | |
| 6,832,618 | B2 | 12/2004 | DeHart | |
| 6,843,667 | B2 | 1/2005 | Khoury | |
| 6,853,399 | B1 | 2/2005 | Gilman et al. | |
| 6,860,764 | B2 | 3/2005 | Khoury | |
| 6,877,264 | B2 | 4/2005 | Mautz | |
| 6,910,549 | B2 | 6/2005 | Kung | |
| 6,927,871 | B1 | 8/2005 | Silverbrook et al. | |
| 6,941,399 | B2 | 9/2005 | Loh | |
| 6,961,239 | B2 | 11/2005 | Schedivy | |
| 6,963,936 | B2 | 11/2005 | Billington et al. | |
| 6,966,533 | B1 | 11/2005 | Kalis et al. | |
| 6,984,784 | B2 * | 1/2006 | Nagasaka et al. | 174/50 |
| 6,993,615 | B2 | 1/2006 | Falcon | |
| 7,034,902 | B2 | 4/2006 | Tajima | |
| 7,074,062 | B2 | 7/2006 | Khoury | |
| 7,080,812 | B2 | 7/2006 | Wadsworth et al. | |
| 7,084,932 | B1 | 8/2006 | Mathias et al. | |
| 7,090,141 | B2 | 8/2006 | Roh et al. | |
| 7,092,988 | B1 | 8/2006 | Bogatin et al. | |
| 7,094,110 | B1 | 8/2006 | Shelton | |
| 7,117,286 | B2 | 10/2006 | Falcon | |
| 7,126,569 | B2 | 10/2006 | Ootsuka | |
| 7,136,940 | B2 | 11/2006 | Roh et al. | |
| 7,146,306 | B2 | 12/2006 | Whitney | |
| 7,158,092 | B2 | 1/2007 | Shen et al. | |
| 7,177,589 | B1 * | 2/2007 | Lynch | 455/3.04 |
| 7,219,942 | B2 | 5/2007 | Schedivy | |
| 7,272,420 | B2 | 9/2007 | Falcon et al. | |
| 7,404,298 | B2 | 7/2008 | Kim et al. | |
| 7,430,111 | B2 | 9/2008 | Lee et al. | |
| 7,686,127 | B2 * | 3/2010 | LeClear et al. | 181/150 |
| 7,736,179 | B2 | 6/2010 | Cook et al. | |
| 2002/0080273 | A1 | 6/2002 | Harrison et al. | |
| 2002/0115353 | A1 | 8/2002 | Zeiler et al. | |
| 2002/0115480 | A1 | 8/2002 | Huang | |
| 2002/0186329 | A1 | 12/2002 | Tong et al. | |
| 2003/0014259 | A1 | 1/2003 | Ferragut, II et al. | |
| 2003/0074912 | A1 | 4/2003 | Maeda | |
| 2003/0103023 | A1 * | 6/2003 | Ootsuka et al. | |
| 2003/0207623 | A1 | 11/2003 | Patel | |
| 2004/0004807 | A1 | 1/2004 | Kim et al. | |
| 2004/0070696 | A1 | 4/2004 | Roh et al. | |
| 2004/0093379 | A1 * | 5/2004 | Roh et al. | 709/203 |
| 2004/0154318 | A1 | 8/2004 | Roh et al. | |
| 2004/0177624 | A1 | 9/2004 | Wo | |
| 2004/0186596 | A1 * | 9/2004 | Roh et al. | |
| 2004/0216471 | A1 | 11/2004 | Kim et al. | |
| 2004/0262185 | A1 * | 12/2004 | Mills | |
| 2005/0013103 | A1 | 1/2005 | Chandley | |
| 2005/0097912 | A1 | 5/2005 | Nam et al. | |
| 2005/0127870 | A1 | 6/2005 | Shin | |
| 2005/0129263 | A1 | 6/2005 | Tamura et al. | |
| 2005/0134472 | A1 | 6/2005 | Jang et al. | |
| 2005/0138948 | A1 | 6/2005 | Lee | |
| 2005/0138949 | A1 | 6/2005 | Jang et al. | |
| 2005/0201067 | A1 | 9/2005 | Hu et al. | |
| 2005/0210168 | A1 | 9/2005 | Chen et al. | |
| 2005/0225292 | A1 * | 10/2005 | Damlamian et al. | |
| 2005/0286900 | A1 | 12/2005 | Bentley et al. | |
| 2006/0007357 | A1 | 1/2006 | Lee | |
| 2006/0021360 | A1 | 2/2006 | Kim et al. | |
| 2006/0031617 | A1 | 2/2006 | Falcon | |
| 2006/0055553 | A1 | 3/2006 | Yeh | |
| 2006/0096303 | A1 | 5/2006 | Kavounas | |
| 2006/0106965 | A1 | 5/2006 | Falcon | |
| 2006/0116177 | A1 * | 6/2006 | Kortum et al. | |
| 2006/0117810 | A1 | 6/2006 | Kendall et al. | |
| 2006/0118694 | A1 | 6/2006 | Lee et al. | |
| 2006/0125360 | A1 | 6/2006 | Kim et al. | |
| 2006/0130078 | A1 * | 6/2006 | Zhang | |
| 2006/0144056 | A1 | 7/2006 | Oh | |
| 2006/0145576 | A1 | 7/2006 | Lee et al. | |
| 2006/0148575 | A1 | 7/2006 | Vitito | |
| 2006/0217600 | A1 | 9/2006 | Lee et al. | |
| 2006/0224050 | A1 | 10/2006 | Lee et al. | |
| 2006/0261220 | A1 * | 11/2006 | Lee et al. | |
| 2007/0038434 | A1 | 2/2007 | Cvetko | |
| 2007/0044497 | A1 | 3/2007 | Roo et al. | |
| 2007/0056306 | A1 | 3/2007 | Trulaske et al. | |
| 2007/0086151 | A1 | 4/2007 | Oh et al. | |
| 2007/0118862 | A1 | 5/2007 | Jeong et al. | |
| 2007/0126413 | A1 | 6/2007 | Oh | |
| 2007/0143376 | A1 | 6/2007 | McIntosh | |
| 2007/0230910 | A1 | 10/2007 | Welch et al. | |
| 2007/0247037 | A1 | 10/2007 | Schenker | |
| 2007/0247800 | A1 | 10/2007 | Smith et al. | |
| 2008/0019082 | A1 | 1/2008 | Krieger et al. | |
| 2008/0101645 | A1 | 5/2008 | Rosen | |
| 2008/0123284 | A1 | 5/2008 | Jaramillo et al. | |
| 2008/0165504 | A1 | 7/2008 | McCoy et al. | |
| 2008/0192411 | A1 | 8/2008 | McCoy | |
| 2008/0247594 | A1 | 10/2008 | LeClear et al. | |
| 2009/0049859 | A1 * | 2/2009 | Moon | 62/457.7 |
| 2009/0158770 | A1 * | 6/2009 | Cohrs et al. | 62/457.9 |

FOREIGN PATENT DOCUMENTS

| | | |
|---|---|---|
| CN | 1683856 | 10/2005 |
| CN | 1683877 | 10/2005 |
| CN | 1683893 | 10/2005 |
| CN | 1742185 | 3/2006 |
| DE | 3528659 | 2/1987 |
| DE | 19644641 | 4/1998 |
| DE | 19706565 | 8/1998 |
| DE | 19800212 | 7/1999 |
| DE | 19839174 | 3/2000 |
| DE | 10242678 | 4/2004 |
| DE | 102005021937 | 11/2006 |
| EP | 0985884 | 3/2000 |
| EP | 1039441 | 9/2000 |
| EP | 1125537 | 8/2001 |
| EP | 1152202 | * 11/2001 |
| EP | 1205719 | 5/2002 |
| EP | 1258991 | 11/2002 |
| EP | 1384965 | 1/2004 |
| EP | 1450105 | 8/2004 |
| EP | 1600886 | 11/2005 |
| GB | 828064 | 2/1960 |
| GB | 2386177 | 9/2003 |
| JP | 7318237 | 12/1995 |
| JP | 2000113315 | 4/2000 |
| JP | 2000274923 | 10/2000 |
| JP | 2001289555 | 10/2001 |
| JP | 2001324258 | 11/2001 |
| JP | 2002011274 | 1/2002 |
| JP | 2002243354 | 8/2002 |
| JP | 2002323858 | 11/2002 |
| JP | 2003065659 | 3/2003 |
| JP | 2003302138 | 10/2003 |
| JP | 2003319573 | 11/2003 |
| JP | 2003323232 | 11/2003 |
| KR | 2004025403 | 9/2002 |
| KR | 20030077254 | 10/2003 |
| KR | 2006074787 | 12/2004 |
| KR | 20050059869 | 6/2005 |
| KR | 20050070958 | 7/2005 |
| KR | 20050075781 | 7/2005 |
| KR | 20050094242 | 9/2005 |
| KR | 2008057639 | 12/2006 |
| KR | 20070004351 | 1/2007 |
| KR | 20080004129 | 1/2008 |
| WO | 9622718 | 8/1996 |
| WO | 9750045 | 12/1997 |
| WO | 9901971 | 1/1999 |
| WO | 2004051164 | 6/2004 |
| WO | 2004083658 | 9/2004 |
| WO | 2004105184 | 12/2004 |
| WO | 2005047786 | 5/2005 |
| WO | 2005057105 | 6/2005 |
| WO | 2006067530 | 6/2006 |
| WO | 2006068456 | 6/2006 |
| WO | 2006086371 | 8/2006 |
| WO | 2007030664 | 3/2007 |

OTHER PUBLICATIONS

Article Entitled "Ford's F-150: The Winner and Still Champion?" by Christopher A. Sawyer— WWW.AUTOFIELDGUIDE.COM (4 Pages).

"I-Enabled Appliances", Copyright 2001 Whirlpool Corporation, 14 Pages, Authored by Whirlpool Corporation, Published During 2001 by Whirlpool Corporation as a Self Contained Pamphlet. The Year of Publication is Sufficiently Earlier Than the Effective U.S. Filing Date and any Foreign Priority Date so That the Particular Month of Publication is not in Issue.

Written Answers to Questions About the Substance of the Disclosure of JP200306569 Submitted to a Japanese/English Translator. (No Translation Was Requested or Provided) .

Office Action for U.S. Appl. No. 11/619,731 Dated Feb. 6, 2008 (8 Pages).

Office Action for U.S. Appl. No. 11/619,731 Dated Feb. 26, 2008 (8 pages).

Miller, Robert C., et al., Taking Handheld Devices to the Next Level, 2004, pp. 36-43.

Corrected International Search Report PCT/US2008/050164 dated May 26, 2008.

Corrected Written Opinion for PCT/US2008/050164.

Declaration of Non-Establishment of ISR for PCT/US2008/050174.

International Search Report PCT/US2008/050145 dated Sep. 6, 2008.

International Search Report PCT/US2008/050147 dated Jan. 3, 2008.

International Search Report PCT/US2008/050154 dated Jul. 4, 2008.

International Search Report PCT/US2008/050159 dated Jun. 6, 2008.

International Search Report PCT/US2008/050164 dated May 8, 2008.

International Search Report PCT/US2008/050170 dated Jun. 4, 2008.

International Search Report PCT/US2008/050181 dated Aug. 13, 2008.

International Search Report PCT/US2008/050183 dated Jan. 4, 2008.

Written Opinion for PCT/US2008/050145.

Written Opinion for PCT/US2008/050154.

Written Opinion for PCT/US2008/050159.

Written Opinion for PCT/US2008/050164.

Written Opinion for PCT/US2008/050170.

Written Opinion for PCT/US2008/050174.

Written Opinion for PCT/US2008/050181.

* cited by examiner

ADAPTER OR APPLIANCE WITH A USER INTERFACE WINDOW

CROSS REFERENCE TO RELATED APPLICATIONS

The present application is a continuation of U.S. patent application Ser. No. 11/650,222 filed Jan. 4, 2007 entitled "ACOUSTIC CHAMBER AS PART OF ADAPTER OR APPLIANCE".

BACKGROUND

The present invention relates to household appliances. More specifically, the present invention relates to appliances that host additional useful devices.

For many U.S. families, a large amount of time spent in the home is spent in the kitchen. As a result, useful devices that are not traditionally located in the kitchen are being brought into the kitchen. Devices such as stereos, televisions and DVD players are now commonly located in the kitchen, typically on a countertop adjacent the traditional kitchen appliances.

One problem with bringing additional devices into the kitchen is that the devices take up counter space that is otherwise needed to perform kitchen tasks. To free up this counter space, it is known to place a television into a door of a refrigerator. However, at this time, the combination of appliances and other devices is limited to the refrigerator and television combination. Additionally, the devices are not readily removable from the host appliance, and the host appliance is not configured to receive different types of devices.

It would be an improvement in the art if there were provided an appliance that could host a variety of consumer electronic devices.

It would also be an improvement in the art if the host appliance provided enhanced acoustical functionality.

SUMMARY

The present invention provides an appliance that provides an access opening for a consumer electronic device.

In one variant, an adapter for a consumer electronic device comprises a user interface having a body; a compartment in the body capable of at least partially enclosing the consumer electronic device and an access opening into the compartment exposing only a portion of the consumer electronic device but exposing at least a portion of the user interface.

In a first variant, an adapter is provided for use with an independently operable consumer electronic device having a user interface. The adapter comprises a holding device forming a device cavity capable of admitting the consumer electronic device. An access opening into the device cavity exposes a portion of the consumer electronic device when the consumer electronic device is in the predetermined orientation. The portion of the consumer electronic device exposed includes at least a portion of the user interface.

In another variant, an electrical appliance for use in conjunction with a portable electronic device, the electrical appliance comprising an appliance cabinet; a holding device generally on the exterior of the appliance, the holding device forming a device cavity capable of admitting the consumer electronic device in a predetermined orientation; an access opening into the device cavity exposing a portion of the consumer electronic device when the consumer electronic device is in the predetermined orientation, the portion of the consumer electronic device exposed including at least a portion of the user interface.

In yet another variant, an adapter is provided for mounting an independently operable consumer electronic device to an appliance, the consumer electronic device having a user interface. The adapter includes a body forming a portion of a device cavity capable of admitting the consumer electronic device in a predetermined orientation, a first interface on the body capable of being coupled to the appliance, a face removably mounted to the holding device and forming a second portion of the device cavity, a second interface in the device cavity for supplying the consumer electronic device with at least one of power, a data channel, and an audio channel.

DETAILED DESCRIPTION OF THE DRAWINGS

Figure 1:
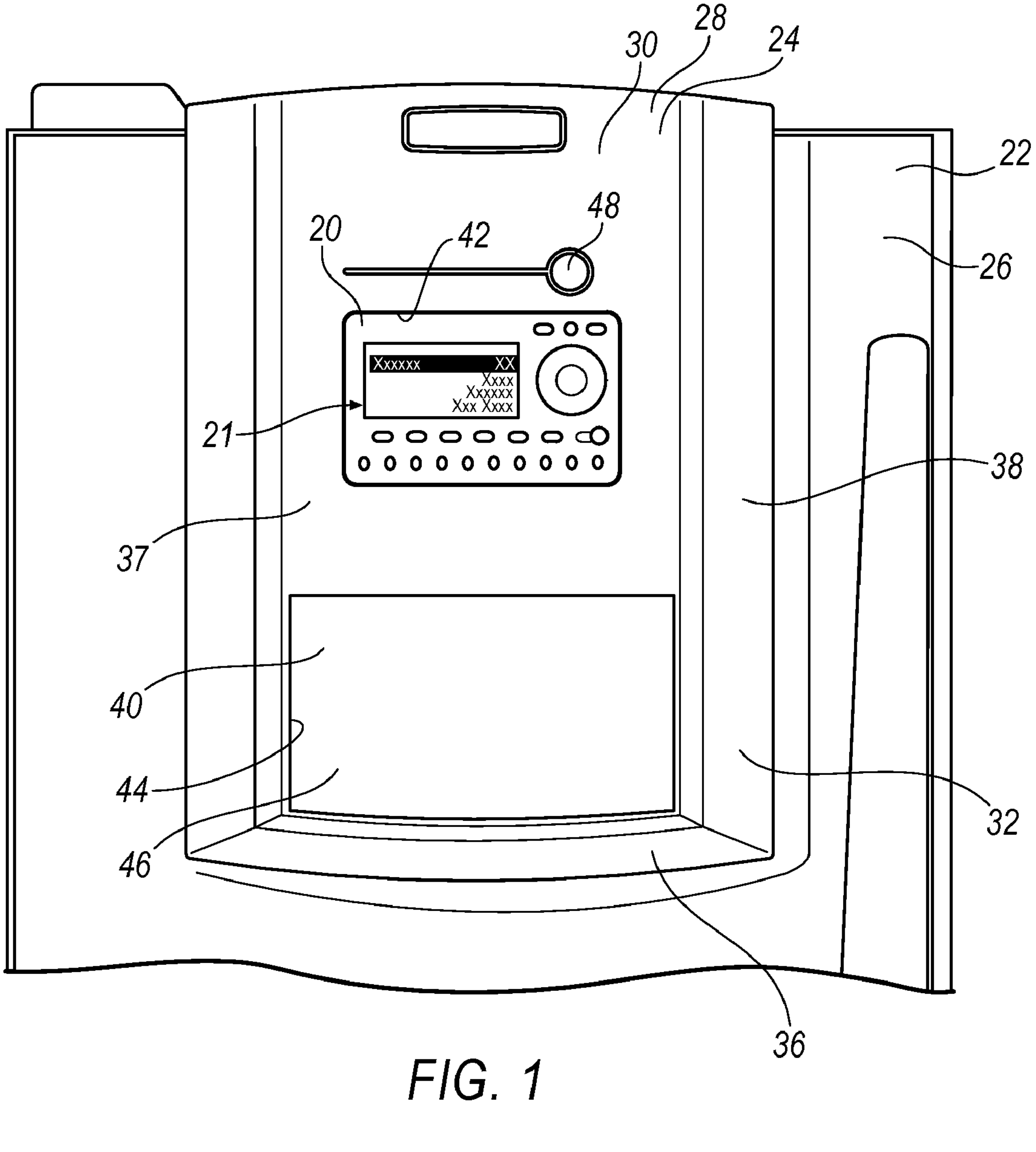
FIG. 1 is a partial, front elevational view of a host appliance and a holding device for holding a consumer electronic device and a speaker, where the holding device is mounted on the host appliance.
Figure 2:
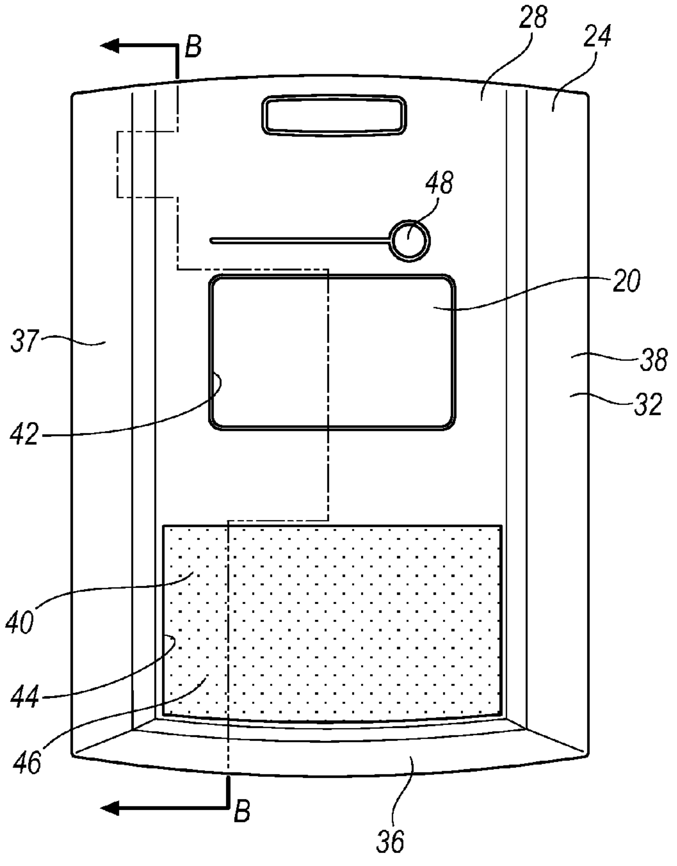
FIG. 2 is front elevational view of the holding device of FIG. 1 configured to be hung from a top surface of the appliance.
Figure 3:
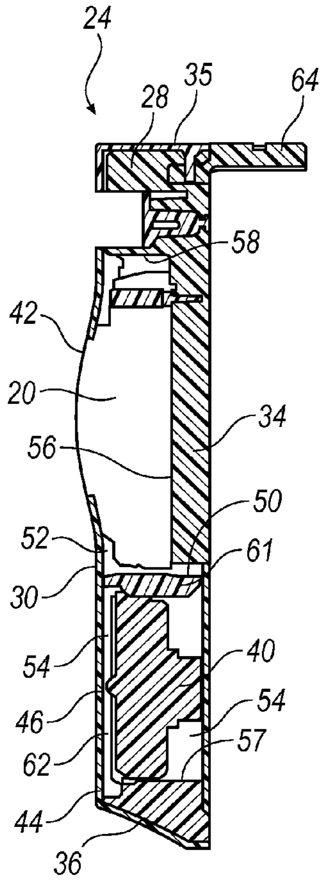
FIG. 3 is a side sectional view of the holding device taken generally along the line B-B of FIG. 2.

As illustrated in FIGS. 1-3, the present invention provides a consumer electronic device (CED) 20 that is mounted in a host appliance 22. Examples of portions of such systems or related systems are described in the following related applications filed contemporaneously herewith: U.S. patent application Ser. No. 11/619,900 entitled "A System for Supplying Service from an Appliance to Multiple Consumer Electronic Devices"; U.S. patent application Ser. No. 11/619,754 entitled "A System for Connecting Dissimilar Consumer Electronic Devices to a Host"; U.S. patent application Ser. No. 11/619,836 entitled "An Appliance with an Adapter to Simultaneously Couple Multiple Consumer Electronic Devices", U.S. patent application Ser. No. 11/619,907 entitled "Appliance with an Adapter to Alternately Couple Multiple Consumer Electronic Devices"; U.S. patent application Ser. No. 11/619,922 entitled "An Appliance with a Removable Adapter and a Removable Consumer Electronic Device"; U.S. patent application Ser. No. 11/619,894 entitled "A Host with Multiple Adapters for Coupling Consumer Electronic Devices"; U.S. patent application Ser. No. 11/619,806 entitled "An Adapter for Coupling a Host and A Consumer Electronic Device Having Dissimilar Standardized Interfaces"; U.S. patent application Ser. No. 11/619,817 entitled "A Host with Multiple Adapters for Multiple Consumer Electronic Devices"; U.S. patent application Ser. No. 11/619,845 entitled "Multiple Hosts with Multiple Adapters for Multiple Consumer Electronic Devices"; U.S. patent application Ser. No. 11/619,850 entitled "An Appliance Door with a Service Interface"; U.S. patent application Ser. No. 11/619,912 entitled "A Cabinet Door with a Service Interface"; U.S. patent application Ser. No. 11/619,873 entitled "Refrigerator Dispenser with a Service Interface and Adapter for a Consumer Electronic Device"; U.S. patent application Ser. No. 11/619,904 entitled "A Service Supply Module and Adapter for a Consumer Electronic Device"; U.S. patent application Ser. No. 11/619,767 entitled "Host and Adapter for Docking a Consumer Electronic Device in Discrete Orientation"; U.S. patent application Ser. No. 11/619,772 entitled "Host and Adapter for Selectively Positioning a Consumer Electronic Display in Visible and Concealed Orientations"; U.S. patent application Ser. No. 11/619,775 entitled "Host and Adapter for Selectively Positioning a Consumer Electronic Device in Accessible and Inaccessible Orientations"; U.S. patent application Ser. No. 11/619,718 entitled "Functional Adapter for Consumer Electronic Device"; U.S. patent application Ser. No. 11/619,731 entitled "Adapter and Consumer Electronic Device Functional Unit"; U.S. patent application Ser. No. 11/650,222 entitled "Acoustic Chamber as Part of Adapter or Appliance"; U.S. patent application Ser. No. 11/649,932 entitled Electrical Accessory Charging Compartment for a Cabinet"; all of which are incorporated herein by reference in their entirety.

The CED 20 may, in some embodiments, be mounted in a host refrigeration appliance 22. While the following description will make reference to a refrigeration appliance as the host appliance 22, it should be appreciated that other appliances can be used to host the consumer electronic device 20, such as but not limited to microwave ovens, dishwashers, washing machines, clothes dryers, and stoves/cooking ranges. Further, while the following description will make reference to "consumer electronic devices" that transmit audio signals, such as satellite radios, high definition radios, and digital music players, the term "CED" refers to any device that transmits data, including but not limited to televisions, DVD players, CD players, personal computers, home weather stations, security systems, home environment controls, mobile phones, and baby monitors.

For all embodiments discussed below, it is contemplated that the host appliance 22 can removably and interchangeably receive a plurality of different CEDs 20. Further, it is contemplated that the CEDs 20 can be of the type that transfer only audio signals. Further, it is contemplated that for all embodiments of host appliance 22, the appliance can transfer data with the CED 20, and can also provide power to the CED.

In a first embodiment, the CED 20 is held in a holding device 24 that is mounted to a front surface 26 of the host refrigeration appliance 22. The holding device 24 includes a generally rectangular body 28 with a generally planar front face 30. Peripheral walls 32 are angled from a back panel 34 to the front face 30 to enclose the holding device 24, although other shapes of the holding device body 28 are envisioned. The peripheral walls 32 preferably include an upper wall 35, a lower wall 36, a first side wall 37 and a second side wall 38.

Preferably, at least one speaker 40 and the CED 20 are mounted into the body 28 of the holding device 24, with the CED mounted above the speaker or vice versa. A side-by-side arrangement of speaker 40 and CED 20 is also contemplated.

Figure 4:
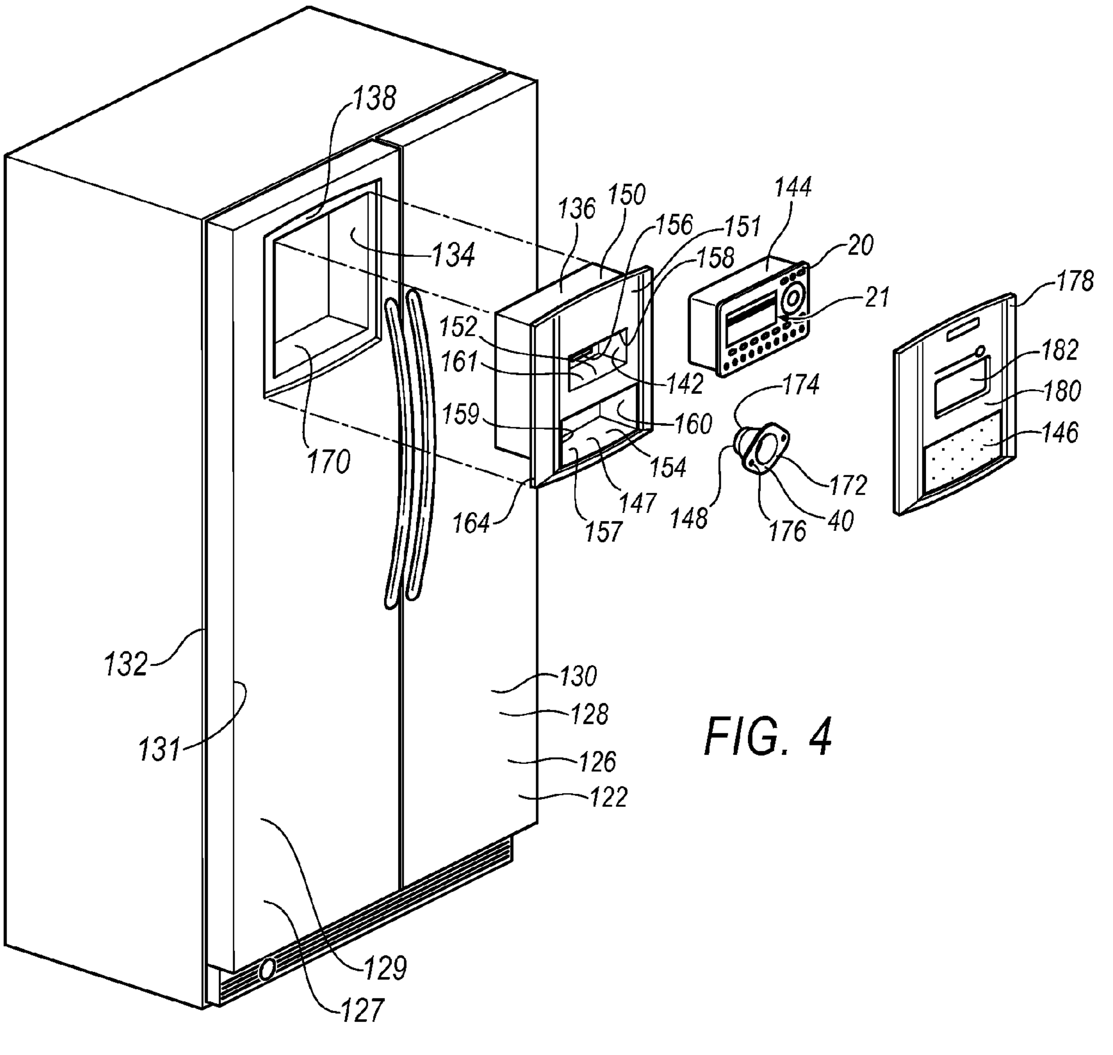
FIG. 4 is a front, exploded perspective view of a host refrigeration appliance incorporating an adapter for receiving a consumer electronic device and a speaker.

The front face 30 of the holding device 24 has a first aperture or access area 42 to permit the user access to the CED 20 mounted in the body 28, including access to a user interface 21 of the CED, such as a dial, an indicator or buttons, as shown in FIGS. 1 and 4. A second aperture 44 is formed in the front face 30 at the location of the speaker 40 in the body 28 to accommodate a speaker grill 46. The speaker grill 46 is of a conventional design that permits the transfer of audio from the speaker 40 to the ambient. The front face 30 of the holding device 24 can be removable from the back panel 34 of the body 28 to expose the CED 20 and the speaker 40, and can include other controllers 48 such as dials, indicators and buttons.

Inside the holding device 24 is an adapter 50 for docking the CED 20. Preferably, the adapter 50 includes first and second adapter chambers or compartments 52, 54 configured to receive the CED and the least one speaker 40, however the adapter can have one or more compartments.

In the preferred embodiment, the compartments 52, 54 are defined by a back surface 56, a bottom surface 57, a top surface 58, first and second side surfaces (not shown) and a middle wall 61, which may be integrally formed or formed in one or more parts. In this configuration, the compartments 52, 54 are generally rectangular with one open surface 62 opposite the back surface 56, and the first compartment 52 being arranged above the second compartment 54.

The compartment 54 in the adapter 50 for receiving the speaker 40 is configured for enhancing audio functionality and quality generated by the speaker. The enhanced functionality of the compartment 54 includes at least one of amplification, tuned frequency response, and sound directionality. In the adapter chamber or compartment 54, the speaker 40 and its associated pressure fluctuations are preferably separated from the CED 20 to maintain a stable environment for the CED, and to provide a robust acoustic environment for the speaker 40. While the above description refers to the compartment 54 of the adapter 50, the same description can be applied to the alternate embodiments described throughout.

The compartments 52, 54 are preferably sized and arranged such that the rearmost extremities of the CED 20 and the speakers 40 abut the back surface 56. In the embodiment of FIGS. 2 and 3, the back panel 34 is thicker at the location of the CED 20 than at the location of the speakers 40. The back surface 56 positions the CED 20 to protrude slightly through the open surface 62 and to the access area 42 of the front face 30. The back surface 56 also positions the speaker 40 adjacent the speaker grill 46.

While the preferred holding device 24 accommodates both the CED 20 and the speakers 40, an embodiment that holds only the CED or only the speakers is envisioned. In the preferred embodiment, the CED 20 is a satellite radio, however, it is contemplated that other CEDs could be used.

In one embodiment, the CED 20 is readily removable from the device holder 24 to enable the user to switch from one CED for another. For example, the user can remove the satellite radio and dock a digital music player into the adapter 50. The adapter 50 may be provided with multiple data connections (not shown) for different types of CEDs 20. Additionally, electronic adapters (not shown) could be provided to allow CEDs 20 having varying output devices (not shown), such as digital music players made by different manufacturers, to be switched in and out of the adapter 50.

A mounting structure 64, such as a bracket or flange, extends generally perpendicularly from the front face 30 of the holding device 24 to hang the holding device from a top surface 66 of the host appliance 22. In this configuration, the back panel 34 of the holding device 24 abuts the front surface 26 of the host appliance 22 and the holding device protrudes from the front surface of the host appliance. Alternately, the holding device 24 can be recessed into a chamber (not shown) in the host appliance 22.

Referring now to FIG. 4, a second embodiment of host refrigeration appliance is shown. Components shared with the first embodiment are designated with identical reference numbers in the 100-series. The host refrigeration appliance 122 includes a first cooling cavity 127 and a second cooling cavity 128 that could be maintained at a different temperature than the first cooling cavity. In the preferred embodiment, one cooling cavity is kept above freezing and one cooling cavity is kept below freezing. A first door 129 and a second door 130 are located at a front surface 126 of the refrigeration appliance 122 and are associated with the first cooling cavity 127 and the second cooling cavity 128, respectively.

The host refrigeration appliance 122 has a chamber 170 formed into a front surface 126 of the appliance, which in the preferred embodiment is at a door 127 of the host appliance. The door 127 has an exterior surface 131 forming the front surface 126 of the host appliance 122, and an interior surface 132 enclosing one of the first or second cooling cavities 127, 128. The chamber 170 is disposed between the interior surface 132 and the exterior surface 131 of the door 127, and the chamber is substantially enclosed except at the exterior surface. The chamber 170 is sized, shaped and arranged to enhance acoustical functionality.

Specifically, the chamber 170 is preferably configured to receive an adapter 150. The adapter 150 has a body 151 including at least one compartment 152, and in the preferred embodiment, the adapter has a first compartment that receives a CED 20 and a second compartment 154 that receives at least one speaker 40. However, it is contemplated that only one compartment 152 for the CED 20 can be provided, and that the speaker 40 can be located remotely. In the case of a remote speaker 40, the speaker can be connected to the host refrigeration appliance 122 with a digital wired network, such as the Ethernet, a wireless data connection via a digital wired network, or an analog data connection, among other types of connections.

Similar to the previous embodiment, the adapter chamber or compartment 154 in the adapter 150 for receiving the speaker 40 is configured for enhancing audio quality generated by the speaker. The door 127 is configured to support the weight of the speaker 40 in the chamber 70. In the adapter chamber or compartment 154, the speaker 40 and its associated pressure fluctuations are preferably separated from the CED 20 to maintain a stable environment for the CED, and to provide a robust acoustic environment for the speaker 40. While the above description refers to the compartment 154 of the adapter 50, the same description can be applied to the alternate embodiments described throughout.

In the preferred embodiment, the first and second compartments 152, 154 of the adapter 150 are defined by a back surface 156, a bottom surface 157, a top surface 158, first and second side surfaces 159,160, and a middle wall 161, which may be integrally formed or formed in one or more parts. The resulting compartments 152, 154 are generally rectangular, however any shape of compartment is envisioned. An opening 162 is located opposite the back surface 156, and a lip 164 is preferably disposed around at least a portion of the periphery of the adapter 150.

The chamber 170 preferably has a receiving structure 134 configured to receive the adapter 150. The adapter 150 likewise has a mating structure 136 to be received by the chamber 170. Preferably, the adapter 150 nests or positively engages the chamber 170, however any receiving structure 134 and any mating structure 136 sufficient to maintain the adapter in the chamber is envisioned. In the preferred embodiment, the adapter 150 is generally rectangular and is received in the generally rectangular chamber 170, however additional retainers (not shown) may be incorporated with the receiving structures.

A recessed surface 138 is preferably disposed around at least a portion of the periphery of the chamber 170 to receive the lip 164 of the adapter 150. It is contemplated that additional retainers or fasteners (not shown) can be used to attach the lip 164 to the recessed surface 138. Additionally, it is contemplated that removable retainers (not shown) can be used to attach the adapter 150 to chamber 170.

A docking structure 142 is located on the adapter 150 and is configured for receiving the CED 20. The CED 20 preferably has a corresponding docking structure 144. Preferably, the CED 20 nests or positively engages the adapter 150, however any corresponding docking structure 144 sufficient to maintain the CED 20 in the adapter is envisioned. In the preferred embodiment, the first compartment 152 is generally rectangular and the CED 20 is preferably rectangular, however additional retainers (not shown) can be incorporated with the docking structures 142, 144.

The CED 20 is docked in the docking structure 142 by introducing the CED into the opening 162 of the compartment 152. In the preferred embodiment, the opening 162 is adjacent the exterior surface 131 of the door 129 when the adapter 150 is mounted in the chamber 170. In this way, the CED 20 is accessible from the exterior surface 131.

Likewise, a speaker docking structure 147 is located on the adapter 150 at the second compartment 154, and the speaker 40 has a corresponding docking structure 148 to locate the speaker in the compartment. Any structure that will sufficiently retain the speaker 40 in the compartment 154 is envisioned.

The first and the second compartments 152, 154 are preferably substantially enclosed except at the opening 162. Specifically, the compartment 154 housing the speaker 40 is preferably enclosed (except at the speaker grill 146) to provide acoustic amplification and/or enhancement. Preferably, the walls 156, 157, 159, 160, 161 of the second compartment 154 securely hold the speaker 40 such that a sound emitting surface 172 of the speaker is adjacent the front surface 126 of the host refrigeration appliance 122. Further, while a rear speaker structure 174 preferably abuts the back surface 156 of the adapter 150, preferably a front speaker structure 176 is spaced from the back surface to eliminate or reduce noise created by vibration or reverberation of the speaker.

Since the surfaces 156-161 of the compartment 154 are preferably solid and contiguous, the speaker 40 located in the compartment is sealed off from an interior surface 132 of the host refrigeration appliance 122. Alternately, if the compartment 154 itself is not substantially enclosed, the adapter 150 when mounted into the chamber 170 can cooperate to seal off the speaker 40 from the interior surface 132 of the host refrigeration appliance 122. In either configuration, it is preferred that the speaker 40 is sealed off from the interior surface 132 of the host refrigeration appliance 122 in an air-tight manner.

The CED 20 is connected to the speaker 40 to transmit an audio signal. Such a connection can be accomplished in a number of ways, including but not limited to an analog wired connection, a digital wired network, a wireless data connection via a digital wired network, or an analog data connection, among other types of connections. It is contemplated that all or some of the components necessary for the transmission of data from the CED 20 to the speaker 40 can be located in the adapter 150, in the chamber 170, in the host refrigeration appliance 122, or in some combination of the above components.

The connection between the CED 20 and the speaker 40 can be accomplished with any known data connection or interface. In the preferred embodiment, all components for the connection between the CED 20 and the speakers 40 are located in the adapter. The CED 20 includes a first audio/data connector (not shown) which connects to a second audio/data connector (not shown) on the first compartment 152. The second audio/data connector (not shown) is connected to a third audio/data connector (not shown) on the second compartment 154, and the third audio/data connector (not shown) connects to a fourth audio/data connector (not shown) on the speaker 40.

In an alternate embodiment, the connection between the CED 20 and the speaker 40 includes a connection to the host refrigeration appliance 122. Further, the host refrigeration appliance 122 may provide power to the CED 20, or the CED may operate on battery power.

Over the top of the adapter 150 is an adaptive component 178, which is preferably a generally planar plate 180 that hides the adapter. The adaptive component 178 provides both an aesthetic service and permits access to the CED 20 through an access opening 182. The adaptive component 178 attaches either to the adapter 150 or to the host refrigeration appliance 122, and is preferably generally flush with the front surface 126 of the host refrigeration appliance. Preferably, the adaptive component 178 is readily removable so that the user is provided with greater access to the CED 20 and the adapter 150.

In one embodiment, the CED 20 is readily removable from the adapter 150, either by removing the adaptive component 178 or through the access opening 182, to enable the user to switch from one CED to another. Additionally, universal connectors or electronic adapters (not shown) could be provided to allow CEDs 20 with varying output devices (not shown), such as digital music players made by different manufacturers, to be switched in and out of the adapter. Alternately, different types of CEDs 20 can be interchanged into the adapter 150, such as a satellite radio to a digital music player.

Figure 5:
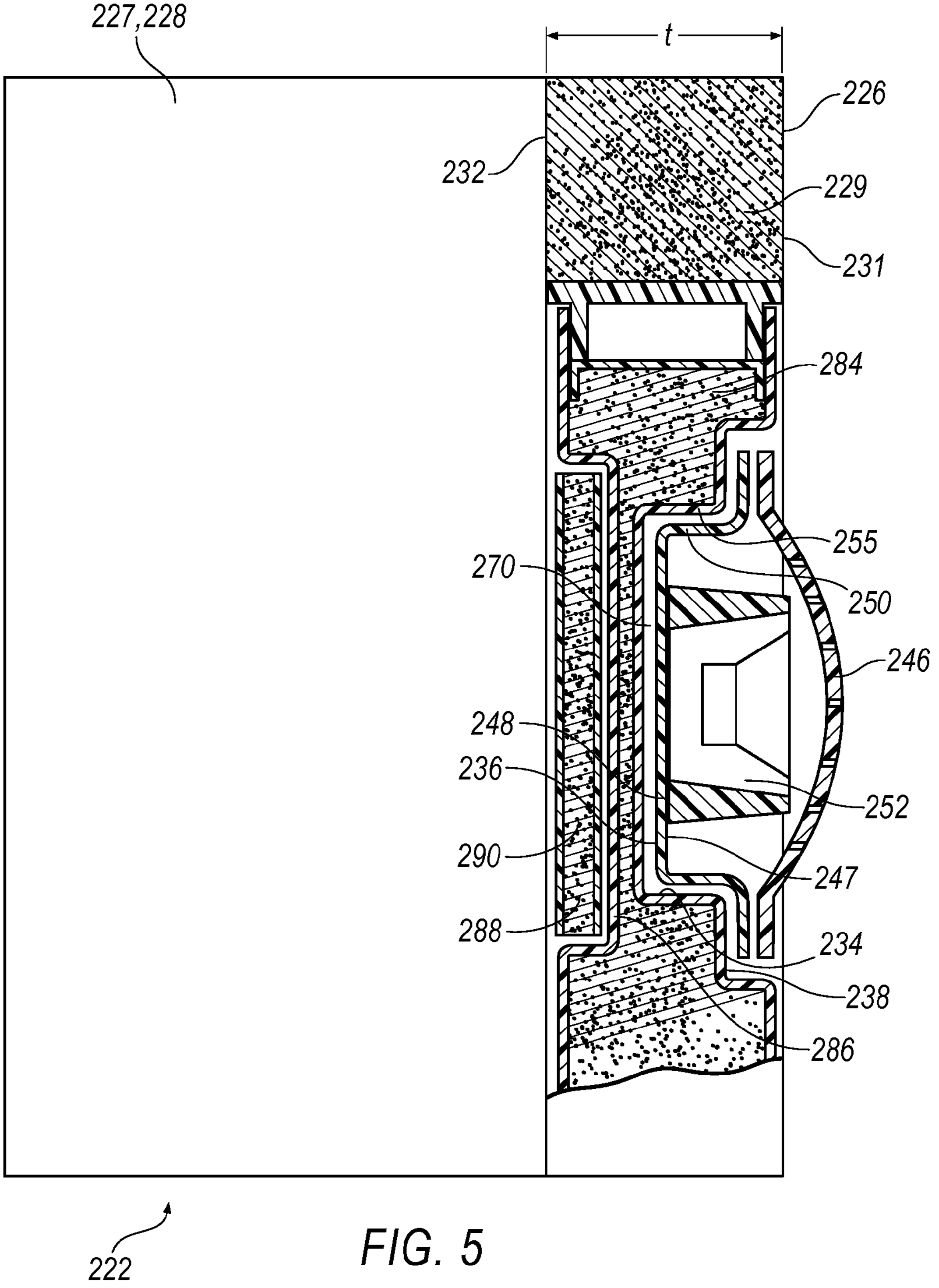
FIG. 5 is a side sectional view of an alternate embodiment of an adapter mounted in a door of a host refrigeration appliance.

Referring now to FIG. 5, components shared with the previous embodiments are designated with identical reference numbers in the 200-series. A chamber 270 is preferably formed in a surface 226 of a door 229 of a host refrigeration appliance 222. An adapter 250 has a single compartment 252 configured for housing at least one speaker 40. The adapter 250 is configured to be received in the chamber 270.

Similar to the previous embodiments, the compartment 252 for receiving the speaker 40 is configured for enhancing audio quality generated by the speaker. The door 229 is configured to support the weight of the speaker 40 in the chamber 270. In the compartment 252, the speaker 40 and its associated pressure fluctuations are separated from the CED 20 to maintain a stable environment for the CED, and to provide a robust acoustic environment for the speaker 40. While the above description refers to the compartment 252, the same description can be applied to the alternate embodiments described throughout.

The adapter 250 is preferably mounted in the chamber 270 to be flush with or recessed from the front surface 226 of the host refrigeration appliance 222. A speaker grill 246 is preferably disposed over the adapter 250 and may protrude slightly from the front surface 226 of the host refrigeration appliance 222. In alternate embodiments, the adapter 250 itself can protrude slightly from the front surface 226 of the host refrigeration appliance 22. Further, the adapter 250 can be located in a holding device 24 that is hung from the top surface 66 of the host refrigeration appliance (FIGS. 1-3).

Similar to the embodiment of FIG. 4, the door 229 has a thickness “t” defined by an exterior surface 131 forming the front surface 226 of the host refrigeration appliance 222, and an interior surface 232 enclosing the cooling cavities 227, 228. The chamber 270 is disposed between the interior surface 232 and the exterior surface 231 of the front door 229, and the chamber is substantially enclosed except at the exterior surface. The chamber 270 is configured to enhance and/or amplify sound.

The chamber 270 is defined by at least one chamber wall 155, which may be formed in one or more parts. The specific geometry of the chamber wall 155 can vary, however, preferably the adapter 250 has a generally flush engagement with the chamber wall.

The chamber 260 has a receiving structure 234 configured to receive the adapter 250. The adapter 250 likewise has a mating structure 236 to be received by the chamber 270. Preferably, the adapter 250 nests or positively engages the chamber 270, however any receiving structure 234 and any mating structure 236 sufficient to maintain the adapter 250 in the chamber 270 is envisioned. The chamber 270 preferably includes a recessed surface 238 around at least a portion of the periphery for receiving a lip 264 of the adapter 250. Additionally, it is contemplated that the adapter 250 is readily removable from the chamber 270.

A docking structure 247 is located on the adapter 250 and is configured for receiving at least one speaker 40. The speaker 40 preferably has any corresponding docking structure 248 sufficient to maintain the speaker in the adapter 250.

The door 229 is preferably hollow and is filled with a pre-selected material in the region adjacent the chamber to support the speaker. Behind the chamber wall 255 is a first insulation material 284, preferably of a high grade. The first insulation material 284 preferably extends within the door 229 at least around the vicinity of the chamber 270. The first insulation material 284 preferably has higher insulation value in the door 229 in the region of the acoustical chamber 270 to minimize heat leakage from the chamber to the host, or from the host to the chamber.

In the preferred embodiment, a rear interior wall 286 is formed along at least a portion of the chamber 270 forming a back cavity 288 between the rear interior wall and the interior surface 132. In the back cavity 288, a second insulating material 290 is disposed. The second insulating material 290 is preferably of even higher grade than the first insulating material 284. In an alternate embodiment, only one insulating material is used, and in a further embodiment, more than two insulating materials are used.

The layers of insulation protect the speaker 40 (and/or a CED) from the temperatures reached in the interior of the host refrigeration appliance 222. Further, the insulation lessens the vibration of host refrigeration appliance components during use of the speakers 40.

Figure 6:
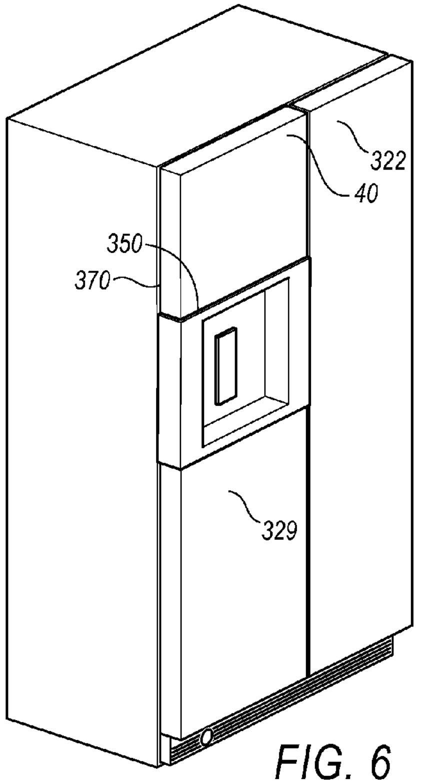
FIG. 6 is a front perspective view of a host refrigeration appliance having a chamber and an audio receiver, where the audio receiver delivers data to speakers that are received in the chamber.

Referring now to FIG. 6, components shared with the previous embodiments are designated with identical reference numbers in the 300-series. In the embodiment of FIG. 6, the host refrigeration appliance 322 includes at least one speaker 40, and the CED 20 is located remotely from the host refrigeration appliance. Similar to the previous embodiments, a chamber 370 is located on a door 329 for receiving an adapter 350, and the adapter has a docking structure (not shown) for receiving the speaker 40. Alternately, the speaker 40 can be directly mounted to the chamber 370.

The connection between the remote CED 20 and the host refrigeration appliance 322 and/or the speakers 40 can be accomplished with any known data connection. In the preferred embodiment, a first audio/data connector on the CED 20 preferably sends an audio signal to a second audio/data connector (not shown) located at a receiver (not shown) at the host refrigeration appliance 322. The connection between the first and second audio/data connectors is preferably wireless. The receiver or the second audio/data connector (not shown) then transfers the audio signal to the speakers 40, through any type of connection known in the art.

Figure 7:
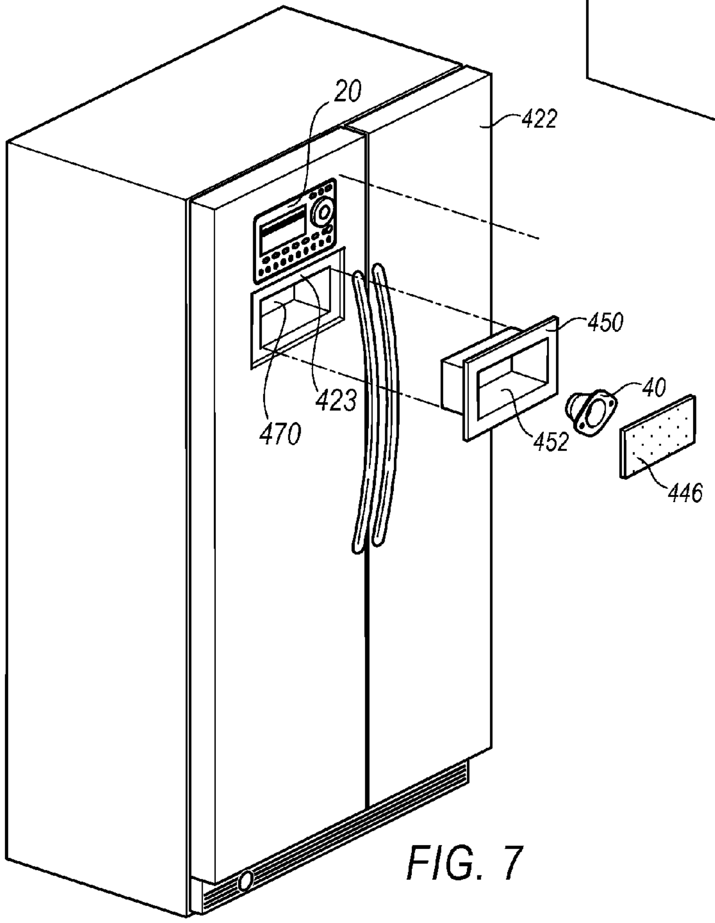
FIG. 7 is a front perspective view of a refrigeration appliance having a chamber and the consumer electronic device, where the chamber receives an adapter for a speaker.

In FIG. 7, components shared with the previous embodiments are designated with identical reference numbers in the 400-series. At least one CED 20 is located in the host refrigeration appliance 422. The CED 20 is either mounted directly into a chamber 470, or alternately, has its own adapter 450 that is mounted into the chamber. A speaker grill 446 is attachable either to the adapter 450 or to the chamber 470.

In the preferred embodiment, at least one speaker 40 is located in a main adapter 450 having at least one compartment 452. In one embodiment, the main adapter 450 is attachable to the chamber 470, as discussed with the previous embodiments. In another embodiment, the main adapter 450 is attachable to a service interface 423 (a preexisting chamber 470 used for various services, such as liquid and ice dispensing) of the host refrigeration appliance 422.

The speakers 40 are connected to the CED 20 with any audio/data connector known in the art. In a first embodiment, the audio/data connector includes jacks and audio wire. Preferably, the audio/data connector includes at least one female jack associated with the service interface 423 (or chamber), and connecting to female jacks of the main adapter 450 with male-male jacks and wire. In a second embodiment, the audio/data connector is a digital wired network, such as the Ethernet. In a third embodiment, the audio/data connector is a wireless connection via a digital wired network, such as wi-fi or Blue Tooth®. In a fourth embodiment, the audio/data connector is an analog data connection where the main adapter has a short range FM receiver which connects to the speaker 40.

Figure 8:
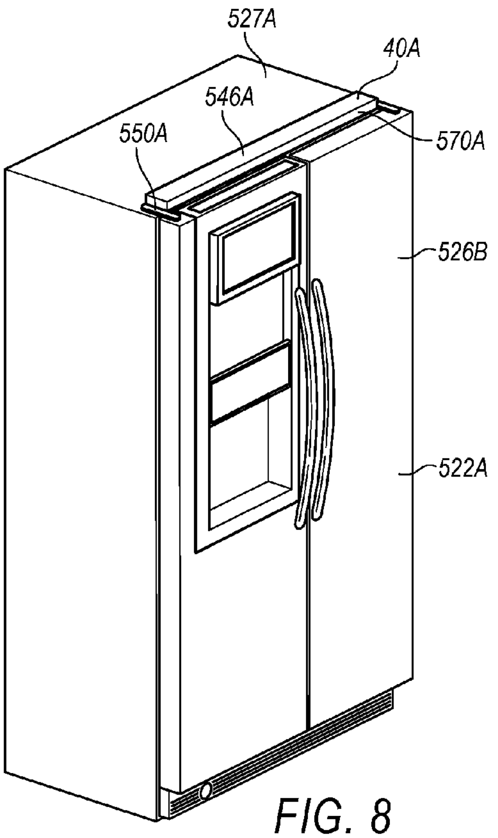
FIG. 8 is a front perspective view of an alternate embodiment of speakers mounted on the top surface of a host refrigeration appliance.
Figure 9:
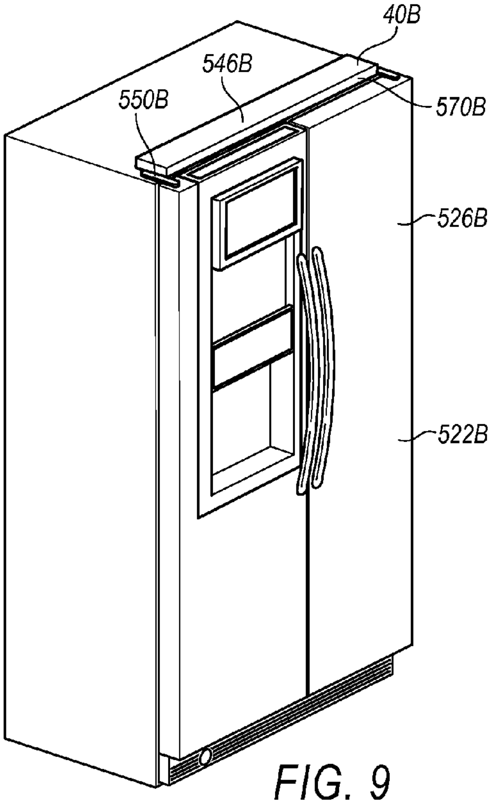
FIG. 9 is a front perspective view of another alternate embodiment of speakers mounted on the top surface of the host refrigeration appliance.

Referring now to the different speaker embodiments of FIGS. 8-14, components shared with the previous embodiments are designated with identical reference numbers in the 500-series, and components differing from each other within FIGS. 8-14 are assigned sub-classes A-G. Referring specifically to FIGS. 8 and 9, two alternate embodiments of top-mounted speakers 40A, 40B are shown. In both embodiments, the speakers 40A,B have a low profile to permit the host refrigeration appliance 522 to be situated under overhead cabinet doors.

In the embodiment of FIG. 8, the speakers 40A are configured to face forward and generally parallel to a top surface 527A of the host refrigeration appliance 522A, and in the embodiment of FIG. 9, the speakers 40B are configured to face upward and generally parallel to a front surface 526B. Similar to the previous embodiments, the speakers 40A, B can either be directly received into a chamber 570A,B formed into the host refrigeration appliance 522A,B, or can be received in an adapter 550A,B that is mounted into the chamber. A speaker grill 546A,B can be placed over the chamber 570A,B or the adapter 550A,B.

Similar to the previous embodiments, the connection between the speakers 40A, 40B and the CED 20 and/or the host refrigeration appliance 522A,B can be accomplished with any known data connection. Further, the CED 20 can be located remotely to or within the host refrigeration appliance 522A,B. Additionally, the speakers 40A, B can be used in conjunction with other devices, such as televisions and DVD players.

Figure 10:
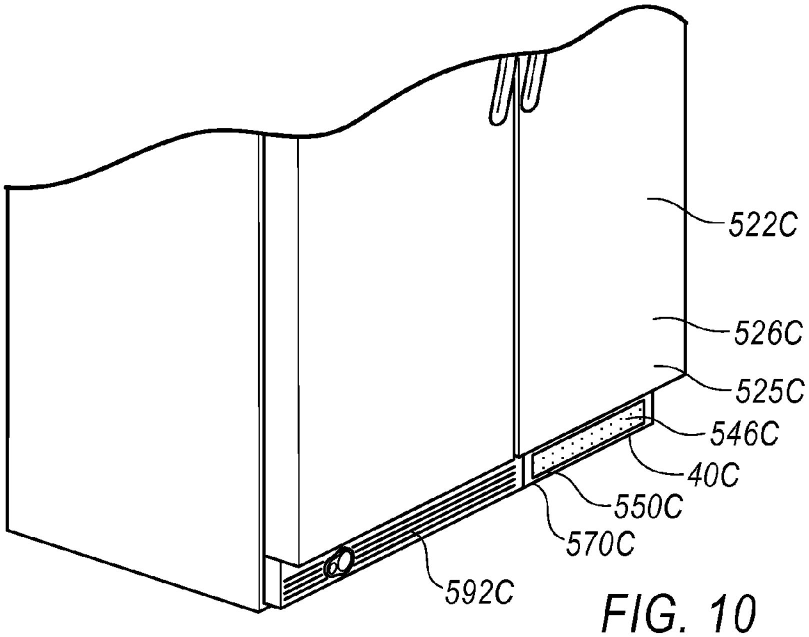
FIG. 10 is a partial, front perspective view of an alternate embodiment of speakers mounted in a chamber located on a lower front surface of a host refrigeration appliance.

An alternate embodiment of speaker 40C is shown in FIG. 10. At least one speaker 40C is placed either directly into a chamber 570C or into an adapter 550C that is located at a bottom portion 525C of the front surface 526C of a host refrigerator appliance 522C. Specifically, the at least one speaker 40C is located at a toe plate 592C. The CED 20 can be located in the host refrigeration appliance 522C, or can be located remotely from the host. Similar to the previous embodiments, the connection between the speakers 40C and the CED 20 and/or host refrigeration appliance 522C can be accomplished with any known data connection. A speaker grill 546C can be placed over the chamber 570C or the adapter 550C.

Figure 11:
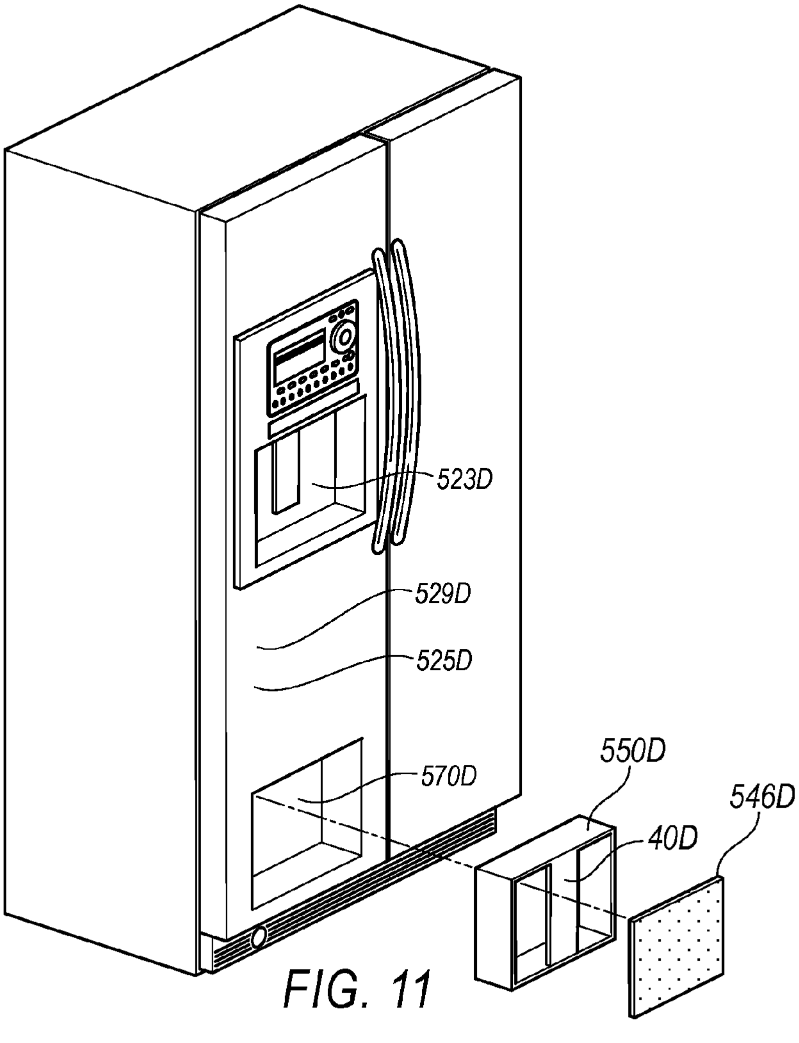
FIG. 11 is a partial, front perspective view of another alternate embodiment of speakers mounted in an adapter to be received in a chamber located in a lower portion of a door panel of a host refrigeration appliance.

Another embodiment of speaker 40D is shown in FIG. 11. At least one speaker 40D is placed either directly into a chamber 570D or into an adapter 550D that is configured to be received at bottom portion 525D of a door 529D of a host refrigerator appliance 522D. It is contemplated that the consumer can interchange speakers 40D as desired. Further, the CED 20 can be located in the host refrigeration appliance 522D (either directly or through an adapter 550D), or can be located remotely from the host. A service interface 523D can also be located on the door 529D of the host refrigeration appliance 522D. A speaker grill 546D can be placed over the chamber 570D or the adapter 550D.

Figure 12:
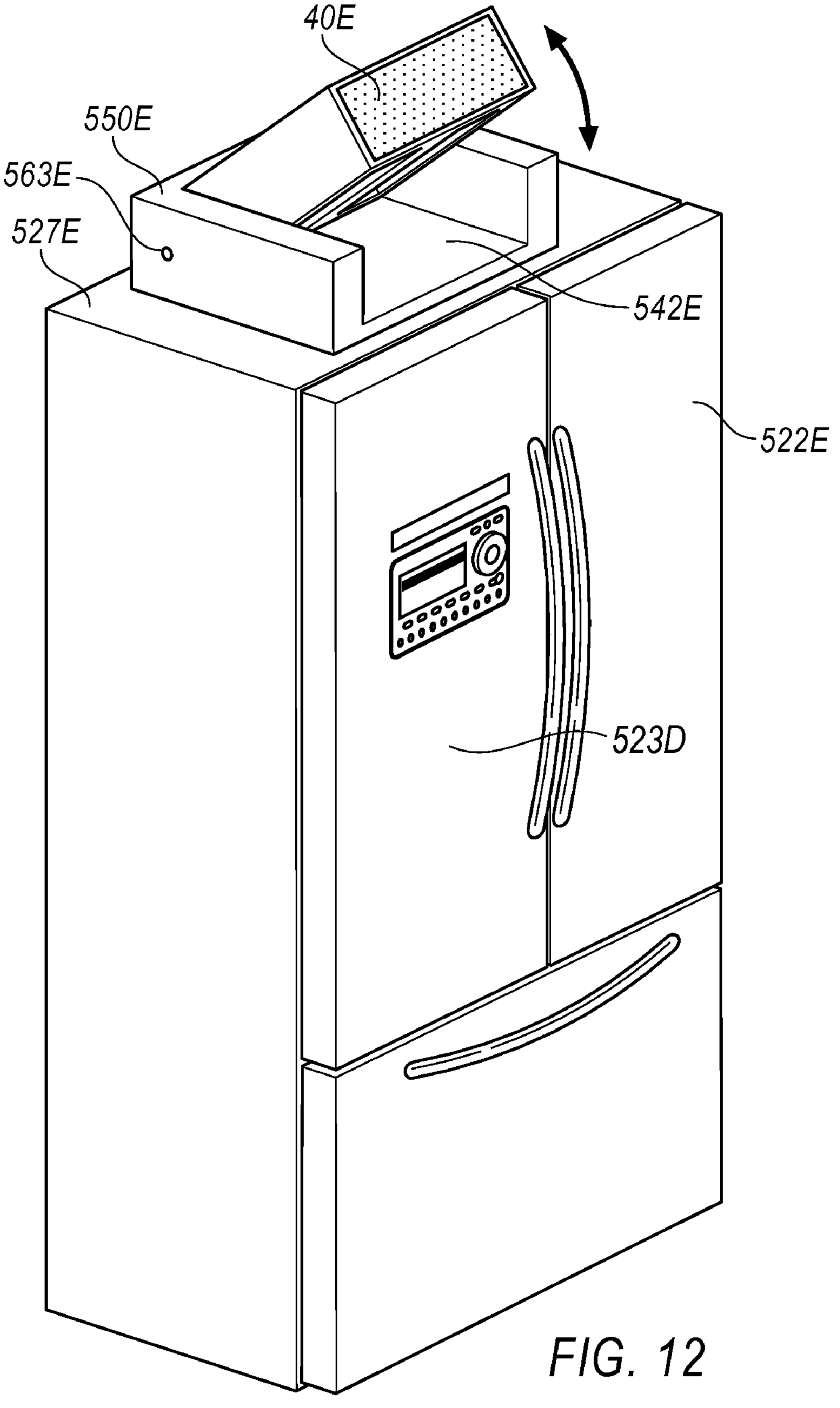
FIG. 12 is a front perspective view of a further alternate embodiment of speakers mounted in an adapter that is configured to be received in a receiving structure located on a top surface of a host refrigeration appliance, where the adapter permits multiple speaker orientations.

Referring now to FIG. 12, a further embodiment of speaker 40E is shown. At least one speaker 40E is located in an adapter 550E on a top surface 527E of a host refrigeration appliance 522E. In the preferred embodiment, the adapter 550E is cradle-shaped having a docking structure 542E for receiving the speaker 40E. At least a portion of the cradle is open for ease of insertion and removal of the speaker 40E, as well as acoustical projection of audio.

The adapter 550E has a pivot structure 563E that allows the speaker 40E to be pivoted into multiple orientations. In the preferred embodiment, the speaker 40E pivots with respect to the adapter 550E, however it is contemplated that the entire adapter can pivot with respect to the top surface 527E of the host refrigeration appliance 522E.

Being able to manipulate the orientation of the speaker 40E can allow a speaker position that hides or makes the speaker less conspicuous, optimizes the sound, and/or directs the sound in an acoustically advantageous way. Further, manipulation of the speaker 40E can allow an orientation that is advantageous for exchanging one speaker for another into the docking structure 542E, or for changing the connections to the adaptor. It is contemplated that the speaker 40E can be positionable in a fully stowed position within a chamber 570 in the top surface of the host 22. Additionally, if the host refrigerator appliance 522E provides other services, it may be advantageous to move the speaker 40E out of the way.

Figure 13:
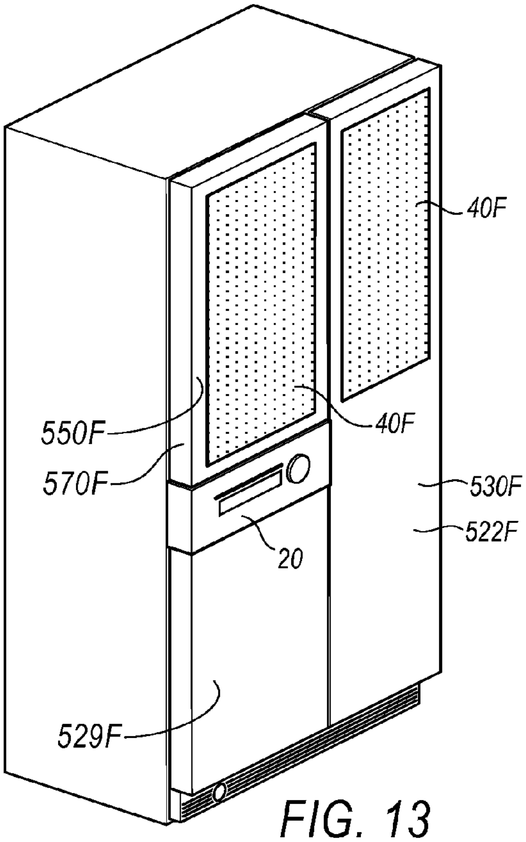
FIG. 13 is a front perspective view of a host refrigeration appliance having the consumer electronic device and an alternate embodiment of speakers mounted in an upper portion of a door panel.

As illustrated in FIG. 13, the host refrigerator appliance 522F can include speakers 40F of varying size and locations, and can include multiple speakers. Preferably, the speakers are 40F are located on first and second doors 529F, 530F at a height that will maximize acoustical projection. Further, the speakers 40F can be mounted directly into a chamber 570F or onto an adapter 550F that is mounted in a chamber. A CED 20 can be mounted on the host refrigeration appliance 522F or can be located remotely.

Figure 14:
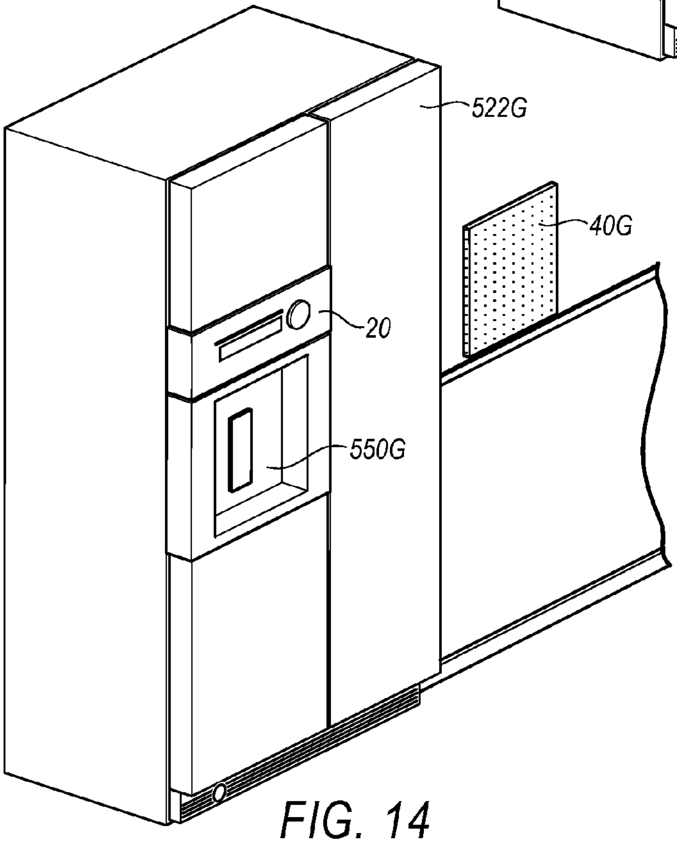
FIG. 14 is a front perspective view of a host refrigeration appliance having the consumer electronic device and a receiving aperture for receiving a speaker, where the speaker is remotely located from the refrigeration appliance.

As shown in FIG. 14, the host refrigerator appliance 522G can include a CED 20 that operates a speaker 40G that is remotely located. Further, the speaker 40G can be stored directly in a chamber 570G on the host refrigerator appliance 522G or can be received in an adapter (not shown) that is placed into the chamber. Preferably, the speaker 40G is connected via a wireless connection to a CED 20 mounted in the host refrigeration appliance 522G.

Figure 15:
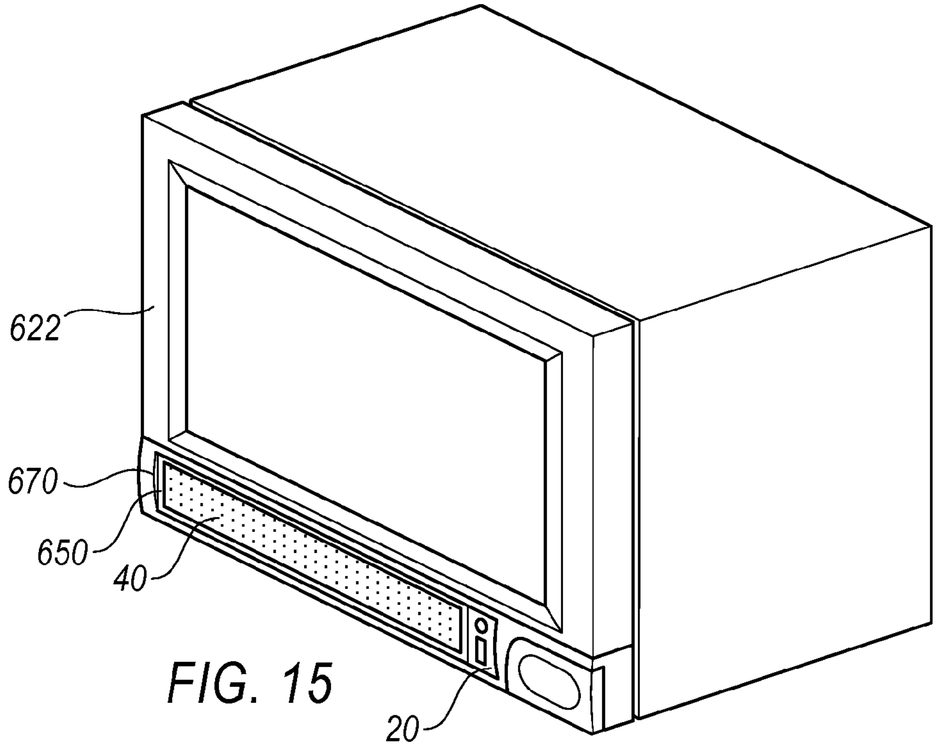
FIG. 15 is a front perspective view of a host microwave appliance having the consumer electronic device and a speaker mounted in a lower front face of the microwave appliance.
Figure 16:
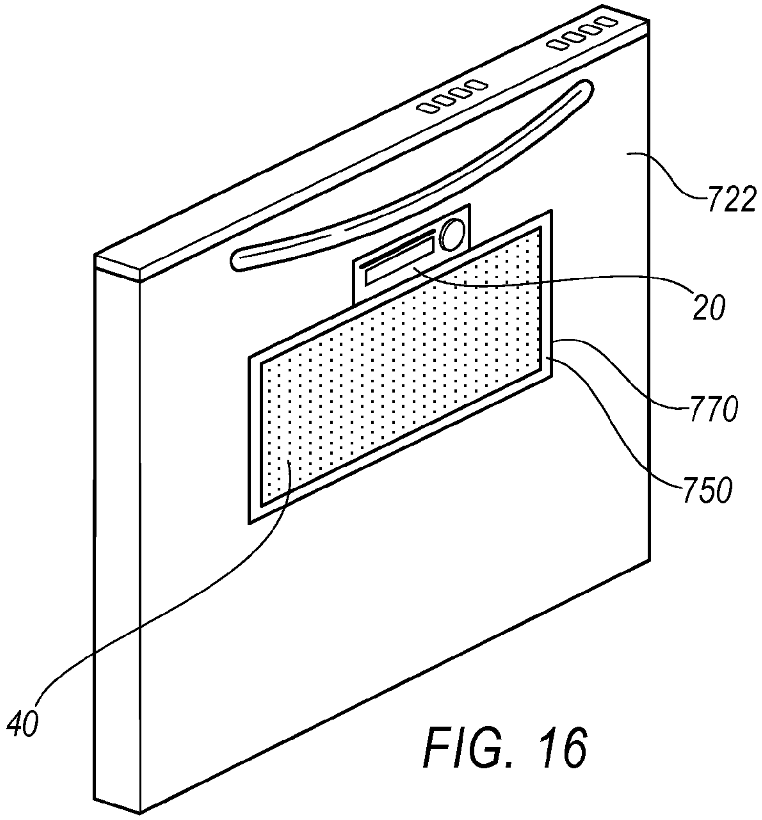
FIG. 16 is a front elevational view of a dishwasher appliance having the consumer electronic device and a speaker mounted in a door of the dishwasher appliance.

While the preceding description references the host appliance as a "host refrigeration appliance 22", it should be appreciated that other appliances can be used to host the consumer electronic device 20, such as appliances that provide heating, cooling, cleaning, drying, refreshing, compressing, cooking, and dispensing. Referring to FIGS. 15 and 16, a host microwave oven 622 and a host dishwasher 722 are shown. As described with respect to the host refrigeration appliance 22, both the microwave and dishwasher hosts 622, 722 include a CED 20 and at least one speaker 40 mounted either directly into a chamber 670, 770 of the host, or alternately, into an adapter 650, 750 that is received into the chamber. Alternately, the CED 20 or the speaker 40 can be located remotely.

It is contemplated that, for all embodiments, the CED 20 can be readily removable and interchangeable. For example, a personal digital music player can be removed from the host 22 (either the adapter 50 or the chamber 70) for use on the person. Then, when the user wants to listen to music in the vicinity of the host appliance 22, the digital music player can be inserted into host. Further, with universal connectors or adapters, different types of CEDs 20 can be interchanged with the host appliance 22. For example, a satellite radio can be interchanged with a digital music player.

For every embodiment of adapter 150, it is contemplated that the docking structure 147 (or receiving structure 134 if the chamber 70 directly receives the CED without an adapter), can be adjustable or reconfigurable to receive different types of CEDs 20 having different shapes or different connectors. Further, the adapter 50 (or chamber 70) can have more than one docking structure 147 (receiving structure 134).

Similarly, it is contemplated that, for all embodiments, the speakers 40 can be readily removable and interchangeable. Further, the speaker 40 can be used remotely from the host 22. It is also envisioned that additional speakers 40 can be used in conjunction with the speaker associated with the host appliance 22, such as on an extended network.

In addition, for all embodiments it is contemplated that any known type of audio/data connection can be used. The connections include, but are not limited to an analog wired connection, a digital wired network, a wireless data connection via a digital wired network, or an analog data connection. It is envisioned that voltage adapters that change AC to DC current, or to step down the DC current can be used. Further, power limiting techniques can be employed to regulate the power to the CED 20.

In all embodiments with a speaker 40 mounted into either the chamber 70 of the host or the compartment 154 in the adapter 150 (adapter chamber), the chamber/compartment 154 is configured for enhancing audio quality generated by the speaker. In the chambers, the speaker 40 and its associated pressure fluctuations are preferably separated from the CED 20 to maintain a stable environment for the CED, and preferably separated from the host appliance 50 to provide a robust acoustic environment for the speaker 40. Additionally, the chamber/compartments 70, 154 preferably prevent or minimize heat exchange between the host appliance 22 and the CED 20 and/or the speaker 40.

It is contemplated that the acoustic chambers/compartments 70, 154 can be designed specifically for each speaker 40. The configuration of each chamber/compartment 70, 154 is preferably designed to take into account the power, size, and frequency of the speaker 40. It is envisioned that the speaker 40 can be enclosed or open to ambient air. It is contemplated that the chamber 70, 154 can be made of plastic, such as styrene.

Various features of a host appliance 22 having a consumer electronic device 20 and/or speakers 40 have been described which may be incorporated singly or in various combinations into a desired system.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

The embodiments of the invention in which an exclusive property or privilege is claimed are defined as follows:

1. An adapter for mounting a consumer electronic device to an appliance, the consumer electronic device having a user interface, the adapter comprising:

a body capable of electronically coupling and mechanically mounting the consumer electronic device, the body comprising:
- a first compartment for receiving the consumer electronic device;
- a second compartment for receiving a speaker;
- a first interface provided within the first compartment for supplying the consumer electronic device with at least one of power and data;
- a second interface provided within the second compartment for supplying the speaker with at least one of power and data; and
- a third interface capable of being coupled to the appliance and communicating a service from the appliance; and a faceplate removably mounted to the body and comprising:

an access opening aligned with a portion of the first compartment; and a covering that permits the transfer of audio therethrough aligned with a portion of the second compartment;

wherein, when the consumer electronic device is received in the first compartment, at least a portion of the user interface is exposed by the access opening, and when the speaker is received in the second compartment, audio from the speaker is transmitted through the covering.

2. The adapter of claim 1 wherein the covering comprises a speaker grill.

3. The adapter of claim 1 wherein the body comprises a lip around at least a portion of the periphery of the body.

4. The adapter of claim 1 further comprising an electrical connector coupled between the first and second compartments.

5. The adapter of claim 1 wherein the first and second interfaces are electrically connected.

6. The adapter of claim 1 wherein the faceplate includes at least one of dials, indicators and buttons.

7. The adapter of claim 1 wherein the faceplate further provides an aesthetic service for hiding at least a portion of the adapter.

8. The adapter of claim 1 wherein the third interface is capable of communicating at least one of data and power from the appliance.

9. The adapter of claim 1 wherein the body comprises a generally rectangular body and the faceplate comprises a generally planar front face mounted to the generally rectangular body.

10. The adapter of claim 1 wherein the first interface is capable of communicating a service from the third interface.

* * * * *